Feb. 3, 1953 C. R. KNIGHT 2,627,588

ELECTROMAGNETIC SCANNING AMPLIFIER CIRCUIT

Filed June 21, 1951 2 SHEETS—SHEET 1

Inventor:
Chester R. Knight,
by Merton D. Morse
His Attorney.

Inventor:
Chester R. Knight,
by Merton D. Morse
His Attorney.

Patented Feb. 3, 1953 2,627,588

UNITED STATES PATENT OFFICE 2,627,588

ELECTROMAGNETIC SCANNING AMPLIFIER CIRCUIT

Chester R. Knight, Schenectady, N. Y., assignor to General Electric Company, a corporation of New York Application June 21, 1951, Serial No. 232,714

6 Claims. (Cl. 315—27)

Figure 1:
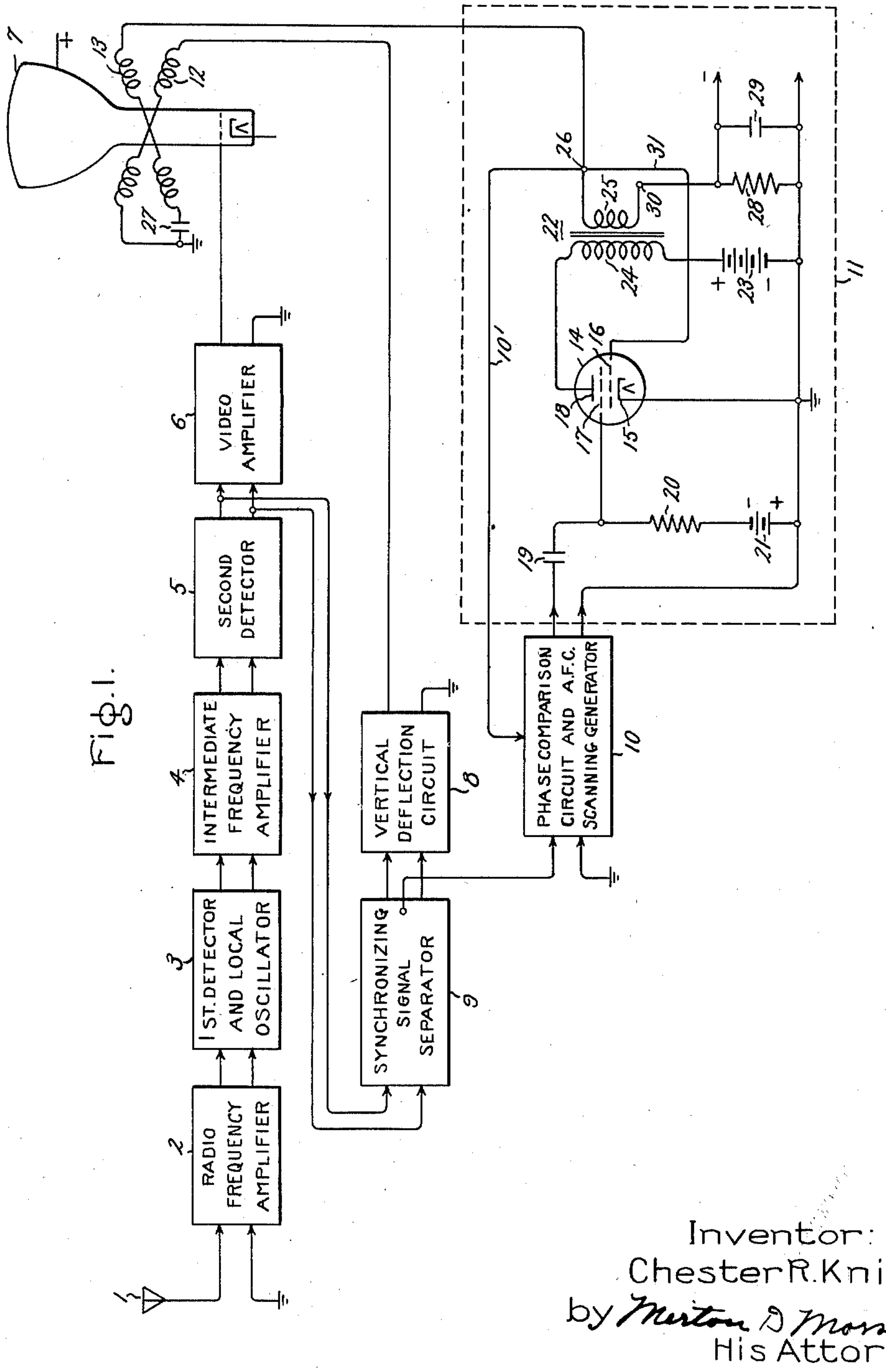

My invention relates to output amplifier circuits for scanning wave generators and more particularly to such output amplifier circuits for scanning wave generators producing current of sawtooth wave form in inductive loads. While my invention is of general utility, it is particularly applicable to the scanning wave generators of a television receiver, especially the line-frequency horizontal scanning wave generator.

It is frequently necessary to pass through an inductance a current of sawtooth wave form having relatively long trace and relatively short retrace intervals. Such a requirement is present, for example, in television receivers employing electromagnetic scanning, wherein it is necessary to provide a sawtooth current wave to inductive deflection coils to systematically magnetically deflect an electron beam back and forth across the screen of a picture-reproducing cathode ray tube. In such television receivers, a source of synchronizing signals is usually connected to a scanning wave generator comprising an intermediate wave-shaping oscillator or a multivibrator. The scanning wave generator is connected to the inductive deflection coils or yoke through a relatively high current capacity output amplifier circuit which may include a current step-up transformer. To prevent oscillations in the inductive-capacitance circuit, formed by the deflection coils and stray capacitance, which may be initiated by the abrupt retrace changes of current and carried over into the early part of the trace portions of the scanning current wave, it has heretofore been necessary to provide an auxiliary electric discharge device, commonly called a "damping diode," connected across the load inductance so as to damp out these transient oscillations.

There is a considerable amount of energy stored in the inductive load at the end of the current wave form trace interval which is dissipated when the damping diode conducts current in its damping action. Since this damping current is relatively great, the damping diode must necessarily be of high curent capacity to be effective. The damping diode, therefore, constitutes an expensive part of the presently known output amplifier circuits.

It is a primary object of my invention to provide a new and improved output amplifier circuit for scanning wave generators supplying sawtooth waveform current to inductive loads.

It is another object of my invention to provide such an output amplifier circuit which requires no auxiliary electric discharge device or damping diode.

In the embodiment of my invention, I employ an amplifying electric discharge device known as the "space-charge-grid" type, which has a cathode, an anode, a space charge grid, and a control grid. Such a discharge device is normally operated with a positive potential bias supplied to the space charge grid from a separate bias source, as will be explained hereinafter.

It is another object of my invention to provide an output amplifier circuit of the type described in the foregoing objects employing a space-charge-grid type electric discharge device so arranged as to eliminate the necessity for a separate source of biasing potential for the space charge grid therein.

In scanning wave generator output amplifier circuits, an extremely high positive potential appears at the anode of the amplifying discharge device during retrace intervals due to the self-induced voltage of an inductive element in the anode circuit, caused by the rapidly decreasing current flowing therethrough. In order to control this anode circuit current and make it decrease rapidly, it has in the past been necessary to provide a highly negative potential at the control grid of the device, thereby requiring that the output signals of the scanning generator itself be relatively great in amplitude.

It is a still further object of my invention to provide an output amplifier circuit of the type described in the foregoing objects which requires a less negative potential at the control grid of the amplifying discharge device therein during retrace intervals and which, therefore, may be operated by lower amplitude input signals from the scanning wave generator.

In carrying out the above-stated objects in one form of my invention, I provide an output amplifier circuit, for a scanning wave generator for supplying current of sawtooth wave form to an inductive load, which employs an amplifying electric discharge device of the space-charge-grid type, having a plurality of electrodes including a cathode and a space charge grid, a control grid, and an anode. The control grid of the device is connected in an input circuit which receives input signals from the scanning wave generator. A transformer is connected with its primary winding in a primary output circuit, including the anode and cathode of the discharge device, and its secondary winding in a secondary output circuit, to be connected to the inductive load. Means including the space charge grid, which is connected to one side of the secondary winding, provide damping of spurious oscillations in the secondary output circuit during current retrace intervals. By the amplifier circuit of my invention, the secondary output circuit provides means to bias the space charge grid positively during current retrace intervals, thereby eliminating the necessity for a separate bias source and affording damping by space charge grid to cathode current flow, and also provides means to bias the space charge grid negatively during current retrace intervals, thereby causing anode current cutoff in the discharge device with a relatively small negative potential on the control grid supplied by the scanning wave generator. I further provide a resistance-capacitance parallel network in the secondary output circuit which stores energy during the scanning current cycle and makes such energy available for utilization as an auxiliary source of voltage and current. The combination of a synchronized scanning wave generator, the output amplifier circuit, and an inductive deflection coil, thus provides in a television receiver a scanning system which needs no conventional and relatively expensive damping diode, which may operate with signals from the scanning wave generator that need go only moderately negative during current retrace intervals, and which makes available energy in the form of voltage and current which otherwise would be dissipated.

Figure 2:
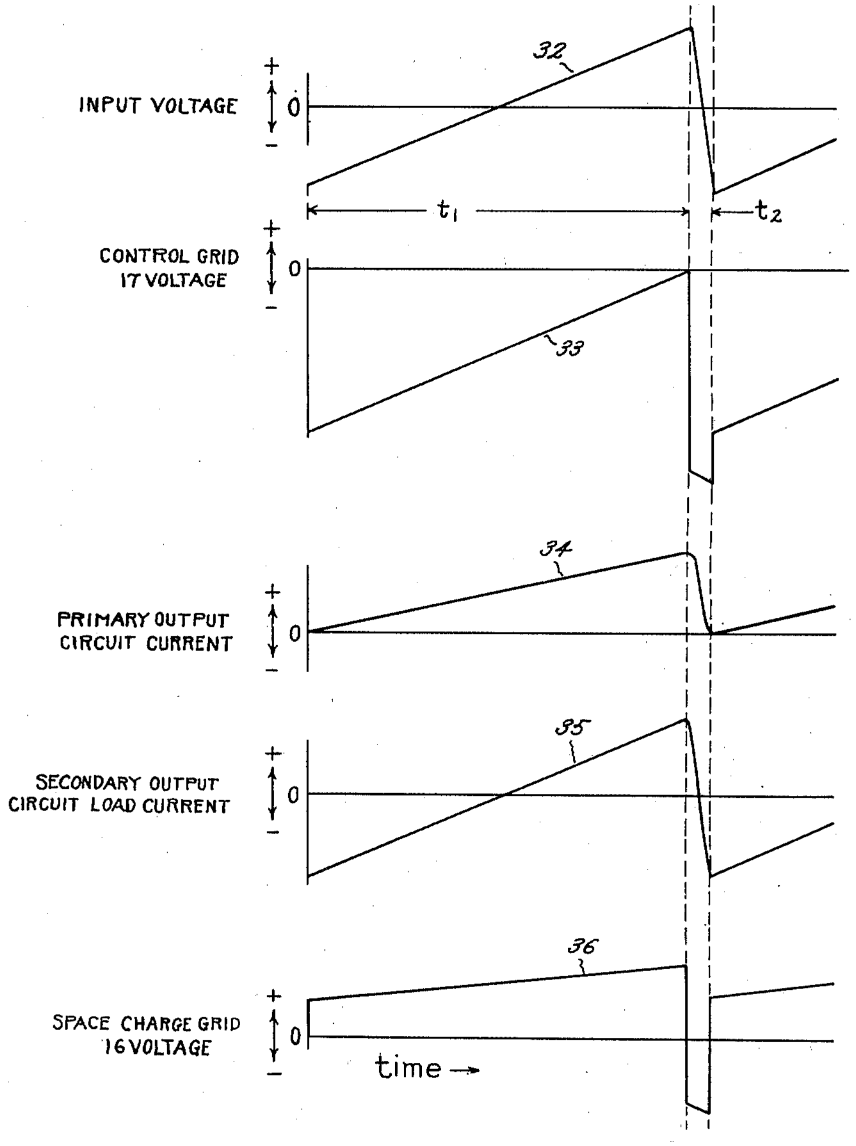

The novel features of my invention are set forth with particularity in the appended claims. For a better understanding of my invention, as to both its organization and operation, and for further objects and advantages thereof, however, reference should be had to the following description and to the accompanying drawing, wherein:

Fig. 1 s a block-and-line diagram of a television receiver employing a preferred embodiment of the output amplifier circuit of my invention, the amplifier circuit itself being shown in schematic form; and Fig. 2 is a series of curves illustrating the manner in which certain potentials and currents in the amplifier circuit vary during one cycle of a sawtooth current supplied to an inductive load.

Referring now to Fig. 1, I have shown a modulated carrier wave television receiver of the superheterodyne type, which includes an antenna 1 connected through a radio frequency amplifier 2 to a first detector and local oscillator 3. To these are connected in cascade relation, in the order named, an intermediate frequency amplifier 4, a second detector 5, a video amplifier 6, and a cathode ray picture tube 7. A vertical deflection circuit 8 is connected to the output of the second detector 5 through a synchronizing signal separator 9. The output of the synchronizing signal separator 9 is also connected to a synchronized horizontal scanning wave generator 10, which in a preferred form is automatically frequency-controlled by the inclusion of a phase comparison circuit. The output signals of the scanning wave generator 10 are supplied as input signals to an output amplifier circuit 11, enclosed by dashed lines, to be more fully described hereinafter. The outputs of the vertical deflection circuit 8 and amplifier 11 are supplied, as shown, to respective pairs of inductive deflection coils 12 and 13, which surround the neck of cathode ray tube 7.

The components 1 through 10 may all be of well-known organization and construction, so that a detailed illustration thereof is believed to be unnecessary. Referring briefly, however, to the operation of the above-described television receiver as a whole, television signals intercepted by antenna 1 are amplified in radio frequency amplifier 2 and then applied to oscillator-detector 3, wherein they are converted into intermediate frequency signals which are, in turn, selectively amplified in intermediate frequency amplifier 4 and delivered to second detector 5. Modulation components of the received signal are detected in detector 5 and are thence applied to video amplifier 6, wherein they are amplified and from which they are supplied in the usual manner to the intensity-control electrode of cathode ray tube 7. The detected modulation components are also applied to the synchronizing signal separator 9 wherein the vertical and horizontal sweep synchronizing signals are separated in a well-known manner, the vertical synchronizing signals being supplied to vertical deflection circuit 8 which, in turn, produces synchronized sawtooth form vertical scanning current through coil 12. Likewise, the horizontal synchronizing signals from separator 9 are supplied to the scanning generator 10, which then provides, in conjunction with output amplifier circuit 11, synchronized current of sawtooth waveform through the inductive load constituted by deflection coils 13. In response to the electric current supplied to them, coils 12 and 13 produce magnetic scanning fields which systematically deflect the electron beam of cathode ray tube 7 in two respective directions normal to one another, so as to trace a rectilinear pattern or raster on the tube screen and thereby to reconstruct a transmitted video image, as is well known.

Turning now more particularly to the scanning wave generator 10 and the output amplifier circuit 11 of Fig. 1, output amplifier circuit 11 comprises an amplifying electric discharge device 14 which is of the space-charge-grid type, having a plurality of electrodes including a cathode 15 and a first or space charge grid 16, a second or control grid 17, and an anode 18, the latter three spaced in the order named from cathode 15. In this type of discharge device, the space charge grid 16, which is immediately adjacent cathode 15, is normally operated at a positive potential with respect to cathode 15 by means of a separate biasing voltage source. Electrons emitted from cathode 15 are accelerated due to this positive potential. However, because of the foraminous nature of the first grid 16, a considerable portion of the emitted electrons are not collected thereby but pass therethrough. After passing through the space charge grid 16, the electrons are decelerated and their flow to anode 18 controlled by a negative potential at which the second or control grid 17 is normally operated, so that a cloud of electrons is formed, situated quite close to the control electrode 17. This cloud of electrons produces a negative charge in the space between first and second grids 16 and 17, hence the name "space charge grid" has been commonly applied to a discharge device of this type having a first grid adjacent the cathode and operated at a positive potential with respect to the cathode, so as to produce on the side opposite the cathode a space charge due to the above-mentioned electron cloud effect. The space charge acts as a virtual cathode which is similar to a physical cathode spaced relatively close to control grid 17. Therefore, the potential of control grid 17 has a relatively great effect upon the flow of anode current, in a manner similar to the control electrode in a conventional discharge device of high amplification, and should be biased to a suitable operating point. For a given control electrode potential, the positive potential of space charge grid 16, in effect, controls the division of cathode current flow between the space charge grid 16 and the anode 18.

In the employment of space-charge-grid discharge device 14 in the amplifier circuit of my invention, cathode 15 may conveniently be connected to a point of zero or ground potential as shown, although such ground connection is not necessary. An input circuit for amplifier 11 is formed by a capacitor 19 and a resistor 20 to include control grid 17 as shown. A source of potential, conventionally illustrated as a battery 21, is connected in the input circuit to provide a negative voltage bias for control grid 17. As illustrated, the input circuit is connected to receive the output signals from scanning wave generator 10; the series arrangement of capacitor 19, resistor 20, and battery 21 is connected across the output terminals of generator 10, while the control grid 17 to cathode 15 path is connected across the series combination of resistor 20 and battery 21 as shown.

Scanning generator 10 may be of any type well known in the art; for instance, it may be a blocking oscillator which is frequently controlled by a phase comparison circuit receiving the horizontal synchronizing pulses from separator 9 and voltage pulses fed back from the output of amplifier circuit 11 over a feedback conductor 10'. A preferred form of a phase comparison circuit and controlled blocking oscillator is shown and described in the copending application of Wolf J. Gruen, Serial No. 87,862, filed April 16, 1949, now Patent 2,598,370 issued May 27, 1952, and assigned to the same assignee as that of the present invention.

An output circuit is provided for effectively connecting the cathode 15-anode 18 path in series with the inductive load, which in this case comprises deflection coils 13. The circuit includes transformer 22 and, of course, a source of direct anode operating potential, conventionally illustrated by a battery 23. Transformer 22, preferably but not necessarily a current step-up transformer, has a primary winding 24 and a secondary winding 25, so that it is logical to consider the output circuit for amplifier circuit 11 as comprising a primary output circuit including the cathode 15-anode 18 path, and primary winding 24, together with battery 23, and a secondary output circuit including secondary winding 25, for connection to the inductive load, i. e., deflection coils 13, to be supplied with current of sawtooth waveform. Anode 18 is connected through primary winding 24 to the positive terminal of battery 23, which in turn is connected from its negative terminal to cathode 15 or a point of ground potential. Secondary winding 25 is connected from a terminal 26 thereof, which is positive during the trace intervals of the sawtooth output current, serially through deflection coils 13 and a centering capacitor 27 to cathode 15 or a point of ground potential, while a parallel circuit formed by a resistor 28 and a capacitor 29 may be connected from cathode 15 or a point of ground potential to the other terminal 30 of secondary winding 25 to complete the secondary output circuit.

Means for damping the aforesaid spurious oscillations in the output circuit, including space charge grid 16, are provided by connection thereto over a conductor 31 to the secondary winding terminal 26, which is positive in potential during the trace intervals of the sawtooth current. As will be explained hereinafter, the secondary output circuit constitutes means for positively biasing the space charge grid 16, the need for a separate biasing source being eliminated thereby, and at the same time provides means for biasing space charge grid 16 negatively during retrace current intervals so that a less negative potential is required at control grid 17 to cause anode current cutoff in device 14.

My invention, therefore, provides a space charge grid type amplifying device wherein the space charge grid is automatically positively biased during the trace current intervals and which provides at the same time a damping circuit comprising the space charge grid 16-cathode 15 path connected across the inductive load so that damping current may flow therethrough, much as in a damping diode.

In Fig. 2, I have shown a series of curves, drawn to a common time scale, illustrating the manner in which the voltage and current at certain points in the circuit of Fig. 1 vary during one cycle of the sawtooth scanning current supplied to inductive deflection coil 13. Curve 32 illustrates the output voltage variation from scanning wave generator 10, which is applied as an input signal to the input circuit of output amplifier 11; curve 33 illustrates the resulting voltage, with respect to cathode 15, applied to control electrode 17; curve 34 illustrates the anode current flowing through the anode 18-cathode 15 path of device 14, and thus through primary winding 24; curve 35 illustrates the resulting sawtooth current flowing through inductive load deflection coils 13; and curve 36 illustrates the voltage appearing at terminal 26 with respect to ground, and applied over conductor 31 as a bias voltage between space charge grid 16 and cathode 15.

Considering now both Figs. 1 and 2, the operation of the output amplifier circuit 11 may be described by beginning with the sawtooth output voltage from scanning wave generator 10 which constitutes the input voltage signal to the input circuit of amplifier 11. The saw-tooth form of voltage curve 32 is a readily obtainable output voltage wave shape from well-known scanning wave generators. The period $t_1$ is designated as the trace interval and the period $t_2$ is designated as the retrace interval. The resultant voltage appearing between control grid 17 and cathode 15 is as shown by curve 33, being shifted to be totally negative by biasing battery 21. Assuming for the moment that space charge grid 16 is biased positively, the voltage applied to control grid 17 causes anode current to grow linearly through the primary output circuit during trace interval $t_1$ as shown by curve 34. This primary output circuit current flowing through primary winding 24 causes a substantially constant voltage to appear across secondary winding 25, terminal 26 being positive in potential with respect to ground, as shown by curve 35, which in turn causes current to increase linearly through inductive load deflection coils 13 as shown by curve 35. The positive potential at terminal 26, therefore, provides over conductor 31 the assumed positive bias on space charge grid 16 during trace interval $t_1$ as clearly illustrated by curve 36. This space charge grid bias is substantially constant, at least constant enough that it does not affect the linear growth of anode current through device 14.

Now during the retrace interval $t_2$, the control grid 17 to cathode 15 voltage swings sharply negative, tending to cause anode current cutoff.

However, this rapid decay of current through primary winding 24 causes a voltage of self-induction in primary winding 24, making anode 18 extremely positive in potential—perhaps four or five times the normal positive anode potential supplied by battery 23. At the same time, the rapidly decreasing primary output circuit current results in a rapidly decreasing secondary output circuit current, which, due to the self inductance of winding 25 and coils 13, causes terminal 26 to be highly negative in potential and a negative bias potential to be supplied to space charge grid 16. This negative potential bias is considerably effective in aiding the potential of control grid 17 to cause anode current cutoff quickly during retrace interval $t_2$. Therefore, the control grid 17 need not be driven so far negative in potential during retrace interval $t_2$ and a smaller amplitude signal from scanning generator 10 may be used effectively.

At the instant ending trace interval $t_1$ when the potential of control grid 17 abruptly drops considerably negative to begin the cumulative action which causes anode current cutoff in device 14, the potential of space charge grid 16 goes negative and the space charge grid 16 cathode 15 path becomes nonconductive. The secondary output circuit then oscillates, due to the inductance of coils 13 and secondary winding 25, and stray circuit capacitance, for ½ cycle, so that the load current is completely reversed during the retrace period $t_2$ as shown by curve 35. These oscillations would continue over into the next trace interval $t_1$ except for the fact that at the end of the ½ cycle of oscillation, terminal 26 and space charge grid 16 again become positive in potential and any further oscillations are prevented by damping current flow over the space charge grid 16 to cathode 15 path.

Consider now that sawtooth current in the trace interval is being supplied to deflection coil 13. If this current tends to have a non-linear increase, the potential of space charge grid 16 is driven more positive, more damping current flows over the space charge grid 16 to cathode 15 path, less current flows in the primary output circuit, and as a result, the current flowing through the inductive load coils 13 is maintained at a linear rate of increase. Conversely, if the secondary output circuit tries to decrease during the trace interval $t_1$, the potential of space charge grid 16 is decreased, the damping current flowing over the space charge grid 16 to cathode 15 path is decreased, more current flows in the primary output circuit, and the current supplied to the inductive load 13 is maintained in its linearly increasing form. It is to be noted that the damping of transient disturbances is a cumulative action which produces very effective maintenance of linear current growth in the inductive load. A non-linear increase in secondary output circuit current not only causes additional damping current to be subtracted therefrom, but also causes less current in the primary output circuit, because of the aforementioned current dividing action of space charge grid 16, which is reflected through transformer 22 to cause less current flow in the secondary output circuit until the load current grows linearly and the potential at space charge grid 16 becomes substantially constant.

Since the sawtooth waveform of current supplied to deflection coils 13 is of relatively high frequency in recurrence, centering capacitor 27 is conveniently placed in series with deflection coils 13 to assure that the sawtooth waveform load current is centered about the zero value and that the electron beam in tube 7 is, therefore, deflected equally in both directions from the center of the cathode ray tube screen. The parallel network of resistor 28 and capacitor 29 may be serially included in the secondary output circuit as shown to provide an auxiliary source of voltage and current for use in other circuits, for instance, in other parts of the television receiver shown by Fig. 1. During the trace intervals of secondary output circuit current, capacitor 29 charges up negatively at its top plate as shown, and cannot discharge very much during the short retrace interval. Therefore, a direct current voltage appears across capacitor 29 during the operation of amplifier circuit 11 which may be filtered and utilized in other circuits. It will be understood that as a smaller external resistive load is connected across capacitor 29, the value of resistor 30 must be increased to keep the time constant of the parallel network constant, resistor 30 being removed entirely when the external resistance load becomes small enough. I have found that in one typical circuit, such as shown in Fig. 1, employing a 250-volt source for battery 23, that a voltage of about 115 volts and a current of about 125 milliamperes are available from capacitor 29, which may be used, for example, as operating voltage and current for the discharge devices in intermediate amplifier 4.

The present invention, therefore, provides an output amplifier circuit for scanning wave generators which requires no damping diode through the use of a space-charge-grid type discharge device. The space charge grid is automatically biased positively by the circuit during current trace interval, requiring no separate biasing source, and negatively during current retrace intervals to considerably aid in causing anode current cutoff so that smaller amplitude input signals may be used. A cumulative damping action occurs by means of current flow over the space charge grid to cathode path which is highly effective in maintaining linear output current growth during current trace intervals. In addition, an auxiliary source of voltage and current may be made available from the amplifier circuit for use in other circuits.

While the present invention has been described by reference to a particular embodiment thereof, it will be understood that numerous modifications may be made by those skilled in the art without departing from the invention. I, therefore, aim in the appended claims to cover all such equivalent variations as come within the true spirit and scope of my invention.

What I claim as new and desire to secure by Letters Patents of the United States is:

1. A scanning generator output amplifier circuit comprising an electric discharge device having a cathode and a first grid, a second grid, and an anode spaced in the order named from said cathode; an input circuit including said second grid for connection to a scanning wave generator; an output circuit for effectively connecting said cathode and said anode in series with an inductive load; means for biasing said first grid normally positive with respect to said cathode; and means for feeding back voltages from said load and impressing them between said first grid and said cathode in a polarity to drive said first grid negative with respect to said cathode over at least a portion of an applied scanning wave.

2. An output amplifier circuit for a scanning wave generator for supplying a current of sawtooth waveform to an inductance load comprising an electric discharge device having a plurality of electrodes including a cathode and a space charge grid, a control grid, and an anode spaced in the order named from said cathode; an input circuit including said control grid for receiving input sawtooth signals having trace and retrace portions from a scanning wave generator; a transformer having a primary and a secondary winding; a primary output circuit including said cathode, said anode, and said primary winding serially connected; a secondary output circuit including said secondary winding for connection to said inductance load to be supplied with a current of sawtooth waveform in response to said input signals; means for biasing said first grid normally positive with respect to said cathode; and means for feeding back voltages from said load and impressing them between said space charge grid and said cathode in a polarity tending to drive said space charge grid negative during said retrace portions, said space discharge grid being effective to assist in damping oscillations in said secondary output circuit during said trace portions.

3. An output amplifier circuit for a scanning wave generator for supplying a current of sawtooth waveform to an inductive load; said amplifier comprising an electric discharge device of the space-charge-grid type having a cathode and a space charge grid, a control grid, and an anode spaced in the order named from said cathode; an input circuit including said control grid for receiving input voltage signals from said scanning wave generator; a current step-up transformer having a primary winding and a secondary windgin; a primary output circuit including said cathode, said anode, and said primary winding; a secondary output circuit including said secondary winding for connection to said inductive load; and a damping circuit including said space charge grid and said cathode connected in parallel with said inductive load across said secondary wining.

4. An output amplifier circuit for a scanning wave generator for supplying current of sawtooth waveform to an inductive load; said amplifier comprising an amplifying discharge device of the space-charge-grid type having a cathode and a space charge grid, a control grid, and an anode spaced in the order named from said cathode; an input circuit including said control grid for receiving input voltage signals from said scanning wave generator; a current step-up transformer having a primary winding and a secondary winding; a primary output circuit including said anode, said cathode, and said primary winding; a parallel resistor-capacitor circuit; a secondary output circuit including said secondary winding and said parallel resistor-capacitor circuit in series to be connected to said inductive load; a damping circuit including said space charge grid and said cathode connected across said secondary winding and said resistor-capacitor circuit with a polarity making said space charge grid positive with respect to said cathode during trace intervals of sawtooth waveform current; an auxiliary supply voltage being available during operation of said amplifier across said resistor-capacitor circuit; and said space charge grid being biased positively during current trace intervals and negatively during current retrace intervals by said secondary output circuit.

5. In a television receiver, the combination of a scanning wave generator, an output amplifier, and an inductive deflection coil to be supplied with deflection current of sawtooth waveform having relatively long trace intervals and relatively short retrace intervals; said output amplifier comprising an electric discharge device of the space-charge-grid type, having a cathode and a space charge grid, a control grid, and an anode spaced in the order named from said cathode; an input circuit including said control grid; said input circuit being connected to said scanning wave generator; a transformer having a primary winding and a secondary winding; a primary output circuit including said cathode, said anode, and said primary winding; a secondary output circuit including said secodnary winding and said deflection coil; means including said secondary output circuit for biasing said space charge grid positively during said current trace intervals and negatively during said current retrace intervals; and means including said space charge grid and said cathode to damp oscillations in said secondary output circuit during said current trace intervals.

6. In a television receiver, the combination of a synchronized scanning wave generator, an output amplifier for said scanning wave generator, and inductive deflection coils to be supplied with deflection current of sawtooth wave form having relatively long trace intervals and relatively short retrace intervals; said output amplifier comprising an electric discharge device of the space-charge-grid type having a cathode and a space charge grid, a control grid, and an anode spaced in the order named from said cathode; an input circuit including said control grid connected to receive input signals from said scanning wave generator; a current step-up transformer having a primary winding and a secondary winding; a primary output circuit including said cathode, said anode, and said primary winding; a secondary output circuit including said secondary winding, said deflection coils, and a parallel network formed by a resistor and a capacitor; said space charge grid being connected to a terminal of said secondary winding which is positive in potential during retrace intervals of said sawtooth waveform current; and a damping circuit provided by said space charge grid and said cathode connected in parallel across said deflection coils; said space charge grid being biased positively during said current trace intervals and negatively during said current retrace intervals by said secondary output circuit during operation; and an auxiliary voltage and current supply being available across said capacitor during operation.

CHESTER R. KNIGHT.

REFERENCES CITED

The following references are of record in the file of this patent:

UNITED STATES PATENTS

| Number | Name | Date |
|---|---|---|
| 2,284,378 | Dome | May 26, 1942 |
| 2,414,546 | Nagel | Jan. 21, 1947 |
| 2,466,784 | Schade | Apr. 12, 1949 |
| 2,492,090 | Bass | Dec. 20, 1949 |
| 2,510,027 | Torsch | May 30, 1950 |
| 2,543,305 | Schwarz | Feb. 27, 1951 |
| 2,545,346 | Edelsohn | Mar. 13, 1951 |
| 2,561,817 | Parker | July 24, 1951 |